(12) United States Patent
Cascella

(10) Patent No.: US 6,661,242 B1
(45) Date of Patent: Dec. 9, 2003

(54) USING A DUT PIN AT KNOWN VOLTAGE TO DETERMINE CHANNEL PATH RESISTANCE IN AUTOMATED TEST EQUIPMENT TEST CHANNELS

(75) Inventor: Anthony J. Cascella, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 36 days.

(21) Appl. No.: 10/027,033

(22) Filed: Dec. 20, 2001

(51) Int. Cl.[7] .............................................. G01R 27/08
(52) U.S. Cl. ........................ 324/713; 324/691; 324/719
(58) Field of Search .................. 324/525, 691, 324/522, 713, 763, 765, 158.1, 719

(56) References Cited

U.S. PATENT DOCUMENTS 5,554,928 A * 9/1996 Stringer .................... 324/158.1
6,331,783 B1 * 12/2001 Hauptman .................. 324/765

* cited by examiner

Primary Examiner—Walter E. Snow
Assistant Examiner—Vincent Q. Nguyen
(74) Attorney, Agent, or Firm—E. Eric Hoffman; Edel M. Young

(57) ABSTRACT

A method for determining contact resistance between an automated test equipment (ATE) system and a device under test (DUT). The DUT is configured to drive a known voltage to a pin. The ATE system is then controlled to force a first test current into the DUT at that pin. A board precision measurement unit (BPMU) of the ATE system then measures the voltage $V_M+$ required to force the first test current. The ATE system is then controlled to force a second test current to flow out of the DUT at the same pin. The ATE system controls the second test current to have the same magnitude (but opposite direction) as the first test current. The BPMU then measures the voltage $V_M-$ required to force the second test current. The contact resistance is then determined in response to the measured voltages $V_M+$ and $V_M-$, and the magnitude of the test current.

12 Claims, 1 Drawing Sheet

US 6,661,242 B1

USING A DUT PIN AT KNOWN VOLTAGE TO DETERMINE CHANNEL PATH RESISTANCE IN AUTOMATED TEST EQUIPMENT TEST CHANNELS

FIELD OF THE INVENTION

The present invention relates to an automated test equipment (ATE) system for testing integrated circuit devices, a corresponding device under test (DUT), and the channel path between these two elements. More specifically, the present invention relates to the accurate determination of the resistance of the channel path between the ATE system and the DUT, and the compensation of subsequent test results in view of this determined channel path resistance.

DESCRIPTION OF RELATED ART

FIG. 1 is a schematic diagram of a channel path of a conventional test system 100 including a device under test (DUT) 101, a test system interface board 102 and an automated test equipment (ATE) system 103. ATE system 103 includes PIN electronics 104 and a board precision measurement unit (BPMU) 105. Resistances R1–R6 extend along the channel path between DUT 101 and the voltage measuring point of BPMU 105. Resistance R1 represents the resistance between DUT 101 and the DUT socket. Resistance R2 represents the resistance between the socket and test system interface board 102 at the end of the channel path near DUT 101. Resistance R3 represents the resistance of a circuit trace on test system interface board 102. Resistance R4 represents the resistance between test system interface board 102 and the PIN electronics at the end of the channel path near ATE system 103. Resistance R5 represents the resistance of PIN electronics 104. Resistance R6 represents the output series resistance of BPMU 105.

Channel path resistance ($R_{CHAN}$) is defined as the total series resistance from the ATE system 103 to DUT 101. Stated another way, the channel path resistance $R_{CHAN}$ is the sum of all the component resistances in the measurement path. Thus, in the example of FIG. 1, the channel path resistance $R_{CHAN}$ is equal to R1+R2+R3+R4+R5+R6. Previously, there has been no accurate method for directly monitoring the channel path resistance $R_{CHAN}$ while ATE system 103 is performing a test on DUT 101. One reason for this is unknown measurement system error present in test system 100. However, it would be useful to be able to monitor changes in the channel path resistance $R_{CHAN}$ due to changes in any or all components of the channel path resistance $R_{CHAN}$. If the actual channel path resistance $R_{CHAN}$ were known, it would be possible to determine whether DUT 101 has erroneously failed a test because of the channel path resistance $R_{CHAN}$.

SUMMARY

Accordingly, the present invention provides a novel method for monitoring ATE channel path resistance $R_{CHAN}$ during testing. The method is useful for maximizing yields of semiconductors with marginal DC output levels. The present invention can be implemented in all ATE measurement environments requiring accurate path resistance determination and compensation. The present invention advantageously provides an increase in product yield, dependent on the product's tolerance of the path resistance. That is, the yield increase will be greater for products with less tolerance to path resistance.

In an embodiment of the present invention, resistance values within the ATE system (i.e., R5 and R6) are known parameters. However, the contact resistance between the device under test and the ATE system (i.e., R1+R2+R3+R4) is not a known parameter. The contact resistance must therefore be determined in order to determine the channel resistance $R_{CHAN}$.

In one embodiment, a method of determining a contact resistance between an automated test equipment (ATE) system and a device under test (DUT) includes the following steps. The DUT is configured to drive a predetermined voltage to a pin of the DUT. The ATE system is then controlled to force a first (known) test current into the DUT. After the first test current has been established, the board precision measurement unit BPMU of the ATE system measures a first voltage provided by the ATE system to force the first test current.

The ATE system is then controlled to force a second test current to flow out of the DUT. The ATE system controls the second test current to have the same magnitude as the first test current (even though the first and second test currents flow in opposite directions). After the second test current has been established, the BPMU of the ATE system measures a second voltage provided by the ATE system to force the second test current.

The channel resistance is then determined in response to the measured first voltage, the measured second voltage and the magnitude of the first (or second) test current.

In a particular embodiment, the internal resistance of the ATE system is also used to determine the channel resistance. For example, the channel resistance may be determined by subtracting the second voltage from the first voltage, dividing the result by twice the magnitude of the first test current and subtracting the internal resistance of the ATE system from the result. Such a calculation effectively cancels any voltage measurement errors inherent in the ATE system.

In one embodiment, the magnitude of the first (and second) test current is selected to be large enough that a difference between the first voltage and the second voltage is large enough to be detectable. In accordance with another embodiment, the magnitude of the first (and second) test current is selected to be small enough that the predetermined voltage of the DUT is not affected by the first and second test currents. To accomplish this, the magnitude of the first (and second) test current can be selected to be at least an order of magnitude smaller than a rated current output of the DUT at the predetermined voltage.

The present invention will be more fully understood in view of the following description and drawings.

DETAILED DESCRIPTION

Figure 1:
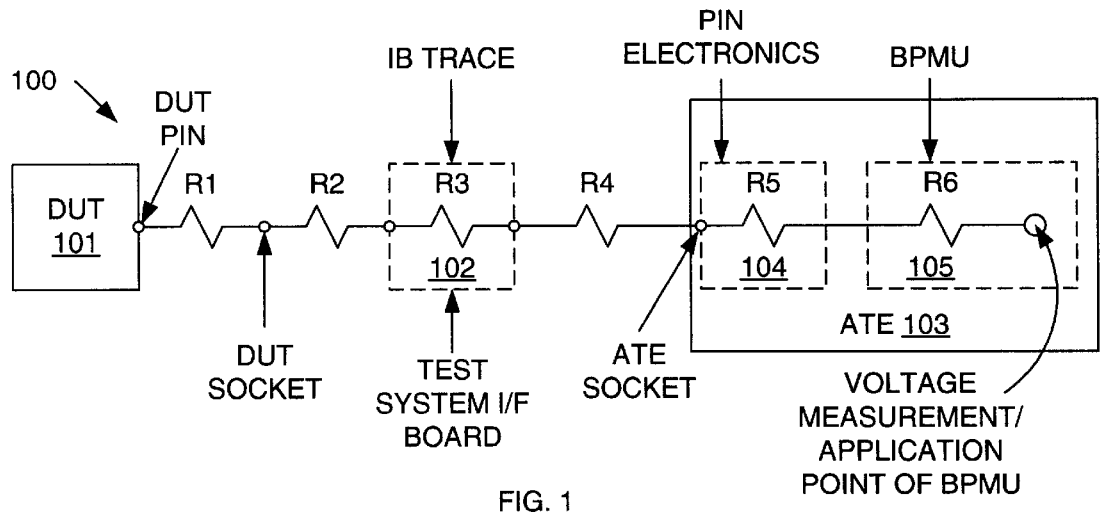
FIG. 1 is a schematic diagram of a channel path of a conventional test system.

In general, the present invention is a method which is applied to test system 100 illustrated in FIG. 1. The present method can be used during final test, wafer sort and characterization test. In one embodiment, ATE system 103 is implemented using the Integra J750 VLSI Test System, commonly available from Teradyne, Inc., 321 Harrison Avenue, Boston, Mass. 02118. However, other ATE systems can be used in other embodiments. In general, this method of the present invention can be applied to any ATE system.

In the described embodiment, the resistance value R6 is equal to 0.500 Ohms. This resistance value can be determined by reference to the published specification of the particular ATE system being used. In the described embodiment, the resistance value R5 has a value in the range of 8.250 Ohms to 8.750 Ohms. However, in other embodiments, the resistance value R5 can have other values. In the described embodiment, resistance value R5 is provided by a resistor in PIN electronics 104 that is precision laser trimmed in the factory of the test system manufacturer. Resistance value R5 is typically designed to operate as a transmission line series matching resistance or a termination resistance for the corresponding driver circuit in PIN electronics 104. When board precision measurement unit (BPMU) 105 is performing a measurement, resistance value, R5 remains in the series channel path.

The precise value of resistor R5 is unique for every tester channel, but can be approximated as 8.5 Ohms as an average value. For slightly more accurate results, a table of trim resistor values for every tester channel can be obtained from the manufacturer of ATE system 103. However, this is not necessary for the practice of the present invention.

Assuming that resistance R5 has a resistance of 8.5 Ohms, the combined resistance of resistors R5 and R6 is equal to 9.0 Ohms (8.5 Ohms+0.5 Ohms). The combined resistance of resistors R5 and R6 represents the bulk of the channel path resistance $R_{CHAN}$.

The remaining components of the channel path resistance $R_{CHAN}$ can be lumped together, and defined as the contact resistance $R_{CONTACT}$. Contact resistance $R_{CONTACT}$ corresponds with the resistance of the elements used to connect ATE system 103 to DUT 101. In the described embodiment, contact resistance $R_{CONTACT}$ is equal to R1+R2+R3+R4, where resistances R1, R2, R3 and R4 have been described above in connection with FIG. 1.

A method for determining the value of contact resistance $R_{CONTACT}$ is described in detail below. This method requires a known voltage source. In accordance with the present invention, the origin of the known voltage source is DUT 101. More specifically, the known voltage source is the known logic high output voltage $V_{OH}$ provided by DUT 101. The logic high output voltage $V_{OH}$ provides more stable results than the logic low output voltage $V_{OL}$. This is because if a current is sourced out of a device switched to a $V_{OL}$ state, then $V_{OL}$ will become less than zero (i.e., a negative voltage with respect to ground). Most CMOS based devices, such as the Virtex II 2V1000 FPGA, are not designed to handle negative voltages when configured for standard $V_{OL}$ voltage levels and may oscillate or become damaged if $V_{OL}$ is less than 0 mV.

In one embodiment, DUT 101 is a Virtex™ II 2V1000 field programmable gate array (FPGA), commonly available from Xilinx, Inc., 2100 Logic Drive, San Jose, Calif. However, it is understood that many other devices can be used to implement DUT 101. The maximum output drive current provided by the Virtex™ II 2V1000 FPGA at the logic high output voltage $V_{OH}$ is 24 mA.

The method of determining the value of $R_{CONTACT}$ includes applying two forcing conditions to test system 100. These two forcing conditions are described in detail below.

Figure 2:
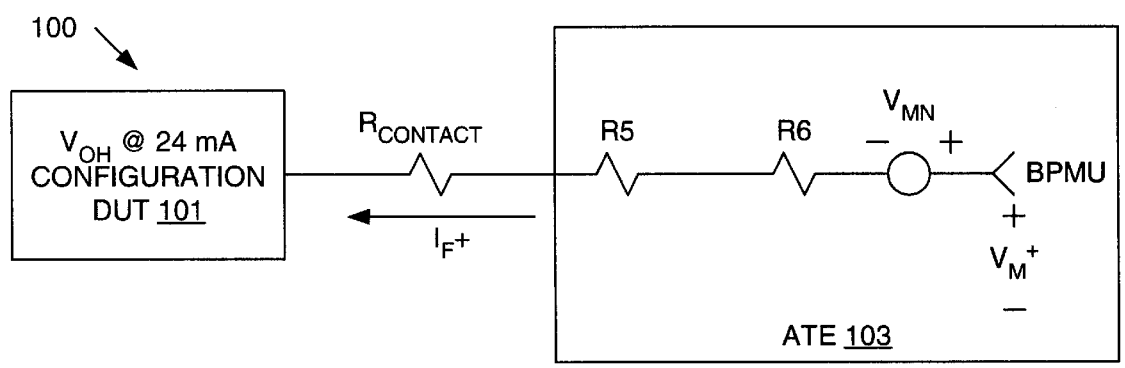
FIG. 2 is a circuit diagram illustrating a first forcing condition of the test system of FIG. 1 in accordance with one embodiment of the present invention.

FIG. 2 is a circuit diagram illustrating the first forcing condition. In the first forcing condition, ATE system 103 is controlled to force a positive current $I_F+$ into DUT 101, while DUT 101 is latched at the logic high output voltage $V_{OH}$, and configured to provide the maximum output drive current of 24 mA. Under these conditions, the resulting voltage $V_M+$ is measured by the board precision measurement unit BPMU 105 of ATE system 103.

Figure 3:
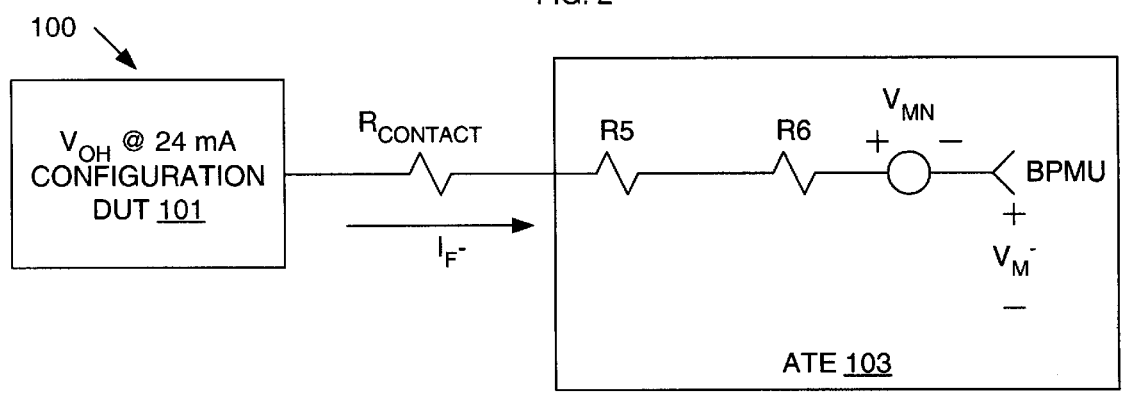
FIG. 3 is a circuit diagram illustrating a second forcing condition of the test system of FIG. 1 in accordance with one embodiment of the present invention.

FIG. 3 is a circuit diagram illustrating the second forcing condition. The order in which the forcing conditions are implemented is not critical. In the second forcing condition, DUT 101 remains latched at the logic high output voltage $V_{OH}$, and remains configured to provide the maximum output drive of 24 mA. ATE system 103 is controlled to force a negative current $I_F-$ out of DUT 101. The negative forced current $I_F-$ flows in the opposite direction of the positive forced current $I_F+$. The negative forced current $I_F-$ is controlled to have the same magnitude as the positive forced current $I_F+$. That is, $|I_F+|=|I_F-|=I_F$. After the negative forced current $I_F-$ has been established, the resulting voltage $V_M-$ is measured by the board precision measurement unit BPMU 105 of ATE system 103.

Applying Kirchoff's voltage law to the circuit of FIG. 2 results in the following equation.

$$V_M{}^+=I_F\times(R_{CONTACT}+R5+R6)+V_{OH}+V_{MN} \qquad (1)$$

Note that $V_{MN}$ represents the additional error in the measurement system due to inaccuracy of ATE system 103. $V_{MN}$ is referred to as the voltage measurement noise or voltage measurement error.

Applying Kirchoff's voltage law to the circuit of FIG. 3 results in the following equation.

$$V_M{}^-=I_F\times(R_{CONTACT}+R5+R6)+V_{OH}+V_{MN} \qquad (2)$$

Subtracting equation (2) from equation (1) provides the following equation.

$$V_M{}^+-V_M{}^-=2\times I_F\times(R_{CONTACT}+R5+R6) \qquad (3)$$

Equation (3) can be restated in the following manner.

$$(R_{CONTACT}+R5+R6)=(V_M{}^+-V_M{}^-)/(2\times I_F) \qquad (4)$$

Equation (4) can further be restated in the following manner, thereby providing an equation for determining the contact resistance $R_{CONTACT}$.

$$R_{CONTACT}=(V_M{}^+-V_M{}^-)/(2\times I_F)-(R5+R6) \qquad (5)$$

In the described embodiment, the following rationalization and bounds are placed on the allowable values Of $I_F$. $I_F$ is selected to be large enough such that $(V_M{}^+-V_M{}^-)$ is detectable. IF is further selected to be large enough that $(V_M{}^+-V_M{}^-)$ is not influenced by the measurement system error, $V_{MN}$. Conversely, $I_F$ is selected to be small enough such that $I_F$ does not affect the $V_{OH}$ characteristic of DUT 101, which is, in general, a function of $I_F$.

In one embodiment of the present invention, it was experimentally determined that when DUT 101 is a Virtex™ II FPGA 2V1000 configured for $V_{OH}$@24 mA, and $$0.5 \text{ mA} \leq |I_F| \leq 1.5 \text{ mA}, \qquad (6)$$

the $V_{OH}$ voltage provided by DUT 101 is not noticeably affected by the forcing current $I_F$. When the forcing current $I_F$ is maintained within this range, the $V_{OH}$ voltage provided by the output transistors of DUT 101 does not change by a noticeable amount. Note that in the described example, the forcing current $I_F$ has a value that is at least one order of magnitude less than the maximum drive current of DUT 101.

It is important to note that the total voltage noise in test system 100 (i.e., $V_{OH}+V_{MN}$) is exactly canceled by using the disclosed technique. (See, equation (3) above.) The total voltage noise is defined to include any and all unwanted voltage signal levels, whether DC, AC, or a combination of DC and AC. Therefore, the final calculated value of $R_{CONTACT}$ is completely independent of the particular device under test, for a particular channel path.

Experimental data for four different Virtex™ II 2V1000 FPGAs is provided below in Table 1, wherein the forcing current $I_F$ has been selected to have a value of 1.0 mA.

TABLE 1

| DEVICE # | $V_M^+$ (V) | $V_M^-$ (V) | $(V_M^+ - V_M^-)/(2 \times I_F)$ | $R_{CONTACT}$ |
|---|---|---|---|---|
| 1 | 3.6086 | 3.5895 | 9.55 Ohms | 0.55 Ohms |
| 2 | 3.6088 | 3.5895 | 9.65 Ohms | 0.65 Ohms |
| 3 | 3.6085 | 3.5892 | 9.65 Ohms | 0.65 Ohms |
| 4 | 3.6081 | 3.5889 | 9.60 Ohms | 0.60 Ohms |

The data in Table 1 was taken for different DUTs, but for the same tester channel. The average value of $R_{CONTACT}$ table 1 is 0.61 Ohms. At a given point in time $R_{CONTACT}$ has a fixed value. However, over an extended period of time, $R_{CONTACT}$ will degrade (i.e., increase in value). This result used to guardband either $V_{OH}$ or $V_{OL}$ at the tested load, thereby maximizing test yield.

For example, the guardband calculations at 24 mA loading can be performed as follows.

Example 1

($R_{CONTACT}$=0.55 Ohms):

$$V_{GUARDBAND} = 24 \text{ mA} \times R_{CONTACT}$$
$$= 24 \text{ mA} \times 0.55 \text{ Ohms}$$
$$= 13.2 \text{ mV}$$

Example 2

($R_{CONTACT}$=2.5 Ohms)

$$V_{GUARDBAND} = 24 \text{ mA} \times R_{CONTACT}$$
$$= 24 \text{ mA} \times 2.5 \text{ Ohms}$$
$$= 60.0 \text{ mV}$$

Thus, if the measured contact resistance $R_{CONTACT}$ has a value of 0.55 Ohms, then a guardband voltage $V_{GUARDBAND}$ of 13.2 mV is used during other tests on the device. Similarly, if the measured contact resistance $R_{CONTACT}$ has an unusually high value of 2.5 Ohms, then a much larger guardband voltage $V_{GUARDBAND}$ of 60.0 mV is used during other tests on the device. As a result, devices having acceptable operating characteristics will not be improperly deemed to have unacceptable operating characteristics because of a relatively large contact resistance $R_{CONTACT}$.

Although the present invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A method of determining a contact resistance between an automated test equipment (ATE) system and a device under test (DUT), the method comprising:

configuring the DUT to drive a predetermined voltage to a pin of the DUT;

using the ATE system to force a first test current into the DUT;

measuring a first voltage required by the ATE system to force the first test current;

using the ATE system to force a second test current out of the DUT, the second test current having the same magnitude as the first test current, but a different direction than the first test current;

measuring a second voltage required by the ATE system to force the second test current; and determining the contact resistance in response to the first voltage, the second voltage and the magnitude of the first and second test currents.

2. The method of claim 1, further comprising:

determining the internal resistance of the ATE system; and determining the contact resistance in response to the internal resistance of the ATE system.

3. The method of claim 2, wherein the contact resistance is determined by subtracting the second voltage from the first voltage, dividing the result by twice the magnitude of the first test current and subtracting the internal resistance of the ATE system from the result.

4. The method of claim 3, wherein a voltage measurement error of the ATE system is effectively canceled from the determination of the contact resistance.

5. The method of claim 3, wherein the internal resistance of the ATE system is significantly greater than the contact resistance.

6. The method of claim 3, further comprising selecting the magnitude of the first and second test currents to be large enough so that a difference between the first voltage and the second voltage is large enough to be detectable.

7. The method of claim 3, further comprising selecting the magnitude of the first and second test currents to be small enough such that the predetermined voltage of the DUT is not affected by the first and second test currents.

8. The method of claim 1, further comprising selecting the magnitude of the first and second test currents to be at least an order of magnitude smaller than a rated current output of the DUT at the predetermined voltage.

9. The method of claim 8, further comprising selecting the magnitude of the first and second test currents to be in the range of 0.5 to 1.5 milli-Amperes.

10. The method of claim 1, further comprising selecting a guard band voltage of the DUT in response to the contact resistance.

11. The method of claim 10 wherein the guard band voltage of the DUT is selected to be equal to the product of the contact resistance and a rated current output of the DUT at the predetermined voltage.

12. The method of claim 10 further comprising using the guard band voltage to determine whether the DUT passes subsequent tests.

* * * * *

UNITED STATES PATENT AND TRADEMARK OFFICE
CERTIFICATE OF CORRECTION

PATENT NO. : 6,661,242 B1
DATED : December 9, 2003
INVENTOR(S) : Anthony J. Cascella It is certified that error appears in the above-identified patent and that said Letters Patent is hereby corrected as shown below:

Column 5,
Line 10, the word "fucking" should read -- forcing --.

Signed and Sealed this

Seventh Day of June, 2005

JON W. DUDAS
*Director of the United States Patent and Trademark Office*